US012593541B2

(12) United States Patent　　(10) Patent No.:　US 12,593,541 B2

Muramoto et al.　　(45) Date of Patent:　Mar. 31, 2026

(54) LIGHT-EMITTING ELEMENT

(71) Applicant: NICHIA CORPORATION, Anan (JP)

(72) Inventors: Eiji Muramoto, Tokushima (JP);
Kosuke Yoshioka, Naruto (JP)

(73) Assignee: NICHIA CORPORATION, Anan (JP)

( * ) Notice:　Subject to any disclaimer, the term of this patent is extended or adjusted under 35 U.S.C. 154(b) by 377 days.

(21) Appl. No.: 18/344,443

(22) Filed:　Jun. 29, 2023

(65)　　　Prior Publication Data

US 2024/0006561 A1　　Jan. 4, 2024

(30)　　　Foreign Application Priority Data

Jun. 30, 2022　(JP) ................................. 2022-105641

(51) Int. Cl.
*H10H 20/831*　　(2025.01)
*H10H 20/825*　　(2025.01)

(52) U.S. Cl.
CPC ....... *H10H 20/8312* (2025.01); *H10H 20/825* (2025.01)

(58) Field of Classification Search
CPC ............. H10H 20/8312; H10H 20/825; H10H 20/8316
See application file for complete search history.

(56)　　　References Cited

U.S. PATENT DOCUMENTS

2011/0062488 A1　　3/2011　Uemura et al.
2012/0235204 A1*　9/2012　Hodota ................ H10H 20/835
257/E33.068

2016/0343907 A1*　11/2016　Kawai ................ H10H 20/8312
2018/0219133 A1　　8/2018　Park et al.
2018/0323341 A1*　11/2018　Koo ..................... H10H 20/816
2019/0157504 A1　　5/2019　Park et al.
2019/0198711 A1　　6/2019　Kim et al.
2021/0305461 A1　　9/2021　Park

FOREIGN PATENT DOCUMENTS

| JP | 2011-216524 A | 10/2011 | |
|---|---|---|---|
| JP | 2012-114343 A | 6/2012 | |
| JP | 2013-084705 A | 5/2013 | |
| JP | 2013-089667 A | 5/2013 | |
| JP | 2015-188109 A | 10/2015 | |
| JP | 2016219652 A | 12/2016 | |
| JP | 2018-529230 A | 10/2018 | |
| JP | 2019-121800 A | 7/2019 | |
| JP | 2019-522360 A | 8/2019 | |
| JP | 2019-522373 A | 8/2019 | |
| KR | 101720304 B1 * | 3/2017 | ............. H10H 20/84 |
| KR | 2020-0086488 A | 7/2020 | |
| WO | 2011071100 A1 | 6/2011 | |

* cited by examiner

*Primary Examiner* — Eliseo Ramos Feliciano
*Assistant Examiner* — Sophia W Kao
(74) *Attorney, Agent, or Firm* — Spencer Fane LLP

(57)　　　ABSTRACT

A shortest distance between a first p-side electrode and a second p-side connection portion is greater than a shortest distance between the first p-side electrode and a closest one of first n-side connection portions most proximate to the first p-side electrode among a plurality of first n-side connection portions in the plan view. The second p-side electrode is located at least in a region between the first p-side electrode and the closest one of the first n-side connection portions in the plan view.

12 Claims, 10 Drawing Sheets

LIGHT-EMITTING ELEMENT

CROSS-REFERENCE TO RELATED APPLICATION

This application claims priority to Japanese Patent Application No. 2022-105641, filed on Jun. 30, 2022, the disclosure of which is hereby incorporated herein by reference in its entirety.

BACKGROUND

The present invention relates to a light-emitting element. For example, Japanese Patent Publication No. 2019-121800 (Kokai) discloses a light-emitting element including a semiconductor structural component, an electrode pad located outside the semiconductor structural component in a plan view, a second electrode located on a surface of a second-conductivity-type (p-type) semiconductor layer of the semiconductor structural component opposite to a surface thereof at which an active layer of the semiconductor structural component is located, and a second conductive layer connecting the second electrode and the electrode pad.

SUMMARY

The present invention is directed to a light-emitting element having high reliability.

According to one embodiment, a light-emitting element includes a semiconductor structure body, a first p-side electrode, a second p-side electrode, a p-side wiring layer, and an n-side wiring layer. The semiconductor structure body includes an n-side layer, a p-side layer, and an active layer positioned between the n-side layer and the p-side layer. The n-side layer includes a plurality of first regions exposed from the active layer and the p-side layer in a plan view. The first p-side electrode is located outside the semiconductor structure body in the plan view. The second p-side electrode is located on a side of a surface of the p-side layer opposite to a surface on which the active layer is located. The p-side wiring layer includes a first p-side connection portion connected with the first p-side electrode, and at least one second p-side connection portion connected with the second p-side electrode. The n-side wiring layer includes a plurality of first n-side connection portions connected to the plurality of first regions of the n-side layer. In the plan view, a shortest distance between the first p-side electrode and the at least one second p-side connection portion is greater than a shortest distance between the first p-side electrode and a closest one of the plurality of first n-side connection portions that is most proximate to the first p-side electrode among the plurality of first n-side connection portions. In the plan view, the second p-side electrode is located at least in a region between the first p-side electrode and the closest one of the plurality of first n-side connection portions.

According to one embodiment, light-emitting element includes a semiconductor structure body, a first p-side electrode, a second p-side electrode, a p-side wiring layer, and an n-side wiring layer. The semiconductor structure body includes an n-side layer, a p-side layer, and an active layer positioned between the n-side layer and the p-side layer. The n-side layer includes a plurality of first regions exposed from the active layer and the p-side layer in a plan view. The first p-side electrode is located outside the semiconductor structure body in the plan view. The second p-side electrode is located on a side of a surface of the p-side layer opposite to a surface of the p-side layer on which the active layer is located. The p-side wiring layer includes a first p-side connection portion connected with the first p-side electrode, and at least one second p-side connection portion connected with the second p-side electrode. The n-side wiring layer includes a plurality of first n-side connection portions connected to the plurality of first regions of the n-side layer. The p-side wiring layer includes a plurality of first openings that overlap the plurality of first regions in the plan view. An area of one of the plurality of first openings positioned at a first distance from the first p-side electrode is greater than an area of one of the plurality of first openings positioned at a second distance from the first p-side electrode in the plan view. The second distance is greater than the first distance. Each of the first distance and the second distance is a shortest distance between the first p-side electrode and a respective one of the first openings. The first distance is the shortest among shortest distances between the first p-side electrode and the plurality of first openings, respectively.

According to the present invention, a light-emitting element having high reliability can be provided.

DETAILED DESCRIPTION

Figure 1:
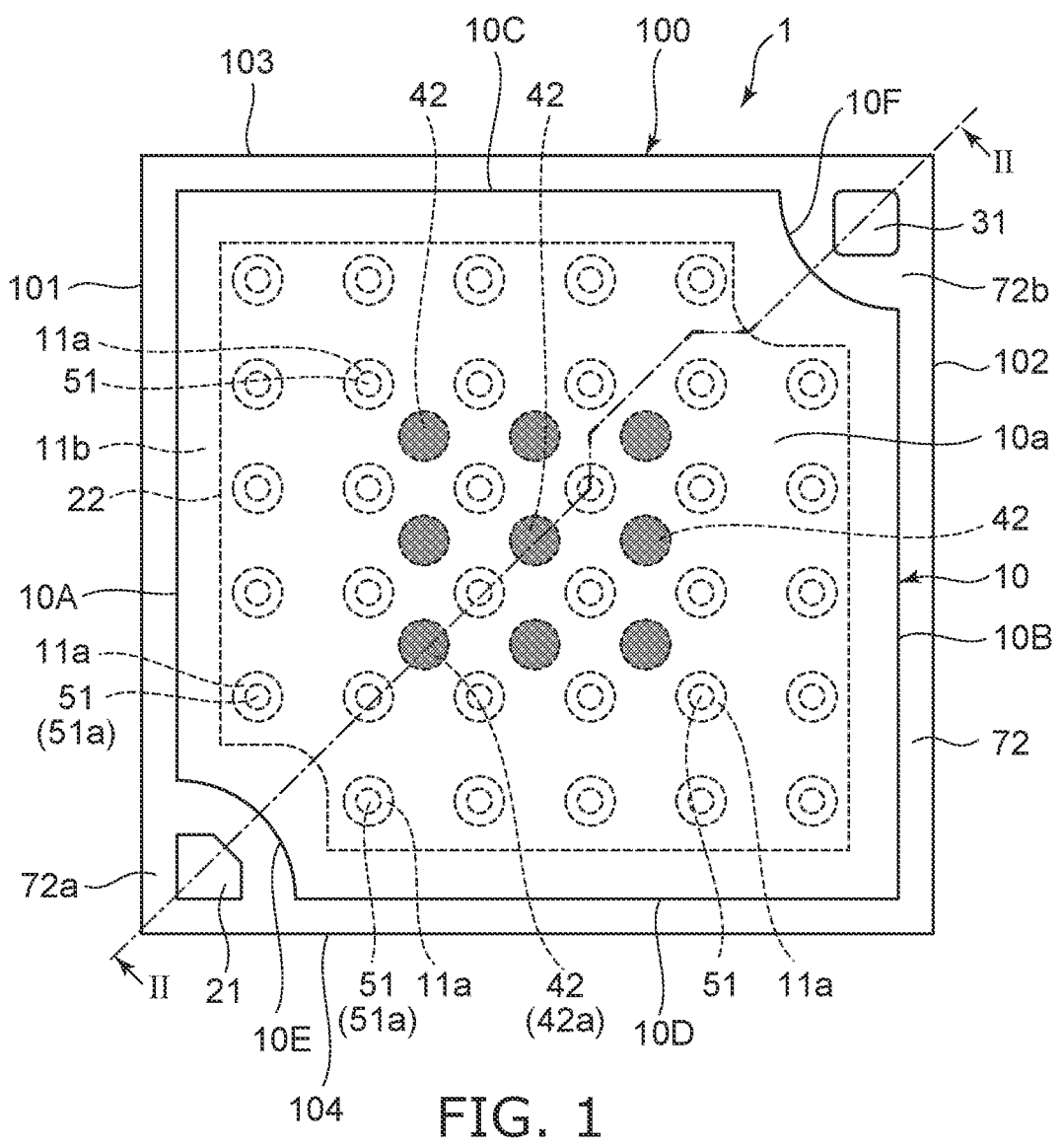
FIG. 1 is a schematic plan view of a light-emitting element of a first embodiment.

Light-emitting elements of embodiments will now be described with reference to the drawings. Unless specifically stated, the dimensions, materials, shapes, relative arrangements, and the like of the components according to the embodiments are not intended to limit the scope of the embodiments thereto, and are merely illustrative examples. The sizes, positional relationships, and the like of the members shown in the drawings may be exaggerated for clarity of description. In the following description, the same names and reference numerals indicate the same or similar members; and a detailed description is omitted as appropriate. End views that show only cross sections may be used as cross-sectional views.

In the following description, terms that indicate specific directions or positions (e.g., "up", "down", and other terms including such terms) may be used. Such terms, however, are used merely for better understanding of relative directions or positions when referring to the drawings. As long as the relationships are the same, the relative directions or positions according to terms such as "up", "down", etc., used when referring to the drawings may not have the same arrangements in drawings, actual products, and the like outside the disclosure. In the specification, when assuming that there are, for example, two members, the positional relationship expressed as "up (or down)" includes the case where the two members are in contact, and the case where the two members are not in contact so that one of the members is positioned above (or below) the other member. In the specification, the term "parallel" includes not only the case where two straight lines, sides, surfaces, etc., and extensions thereof do not intersect, but also the case where the two straight lines, sides, surfaces, etc., intersect at an angle within 10°.

First Embodiment

Semiconductor Structure Body

Figure 2:
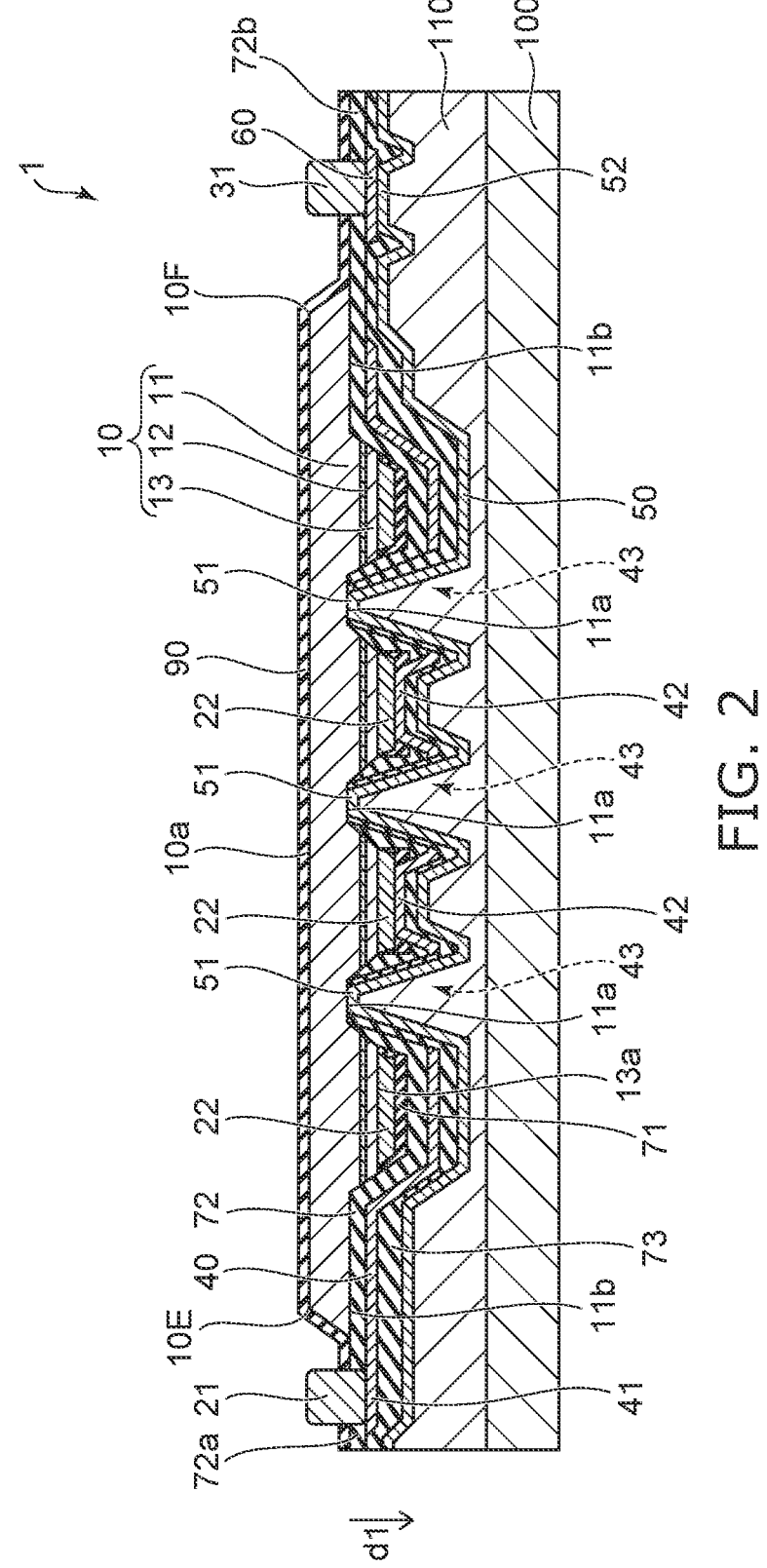
FIG. 2 is a schematic cross-sectional view along line II-II of FIG. 1.

As shown in FIGS. 1 and 2, a light-emitting element 1 of a first embodiment includes a semiconductor structure body 10. The semiconductor structure body 10 is made of a nitride semiconductor. In the present specification, the term "nitride semiconductor" includes, for example, all compositions of semiconductors represented by the chemical formula $In_xA$-$l_yGa_{1-x-y}N$ ($0 \leq x \leq 1$, $0 \leq y \leq 1$, and $x+y \leq 1$) for which the composition ratios x and y are varied within the ranges. The term "nitride semiconductor" further includes a semiconductor further containing Group V elements other than N (nitrogen) in the chemical formula above, a semiconductor further containing various elements added to control various properties such as the conductivity type, etc.

As shown in FIG. 2, the semiconductor structure body 10 includes an n-side layer 11, a p-side layer 13, and an active layer 12. In the present specification, the direction from the n-side layer 11 toward the p-side layer 13 is defined as a first direction d1. The active layer 12 is positioned between the n-side layer 11 and the p-side layer 13 in the first direction d1.

The active layer 12 is a light-emitting layer that emits light, and has, for example, a MQW (Multiple Quantum Well) structure including a plurality of barrier layers and a plurality of well layers. For example, the active layer 12 emits light having a peak wavelength of not less than 210 nm and not more than 580 nm. The n-side layer 11 includes a semiconductor layer containing an n-type impurity. The p-side layer 13 includes a semiconductor layer containing a p-type impurity.

As shown in FIG. 1, the semiconductor structure body 10 includes a first outer edge 10A, a second outer edge 10B, a third outer edge 10C, and a fourth outer edge 10D. The first outer edge 10A, the second outer edge 10B, the third outer edge 10C, and the fourth outer edge 10D are straight lines in a plan view. The lengths of the first outer edge 10A, the second outer edge 10B, the third outer edge 10C, and the fourth outer edge 10D in a plan view are, for example, not less than 300 μm and not more than 2000 μm. In a plan view, the first outer edge 10A and the second outer edge 10B are parallel to each other, and the third outer edge 10C and the fourth outer edge 10D are parallel to each other. In a plan view, the first outer edge 10A and the second outer edge 10B intersect, e.g., are orthogonal to, the third outer edge 10C and the fourth outer edge 10D.

In a plan view, the semiconductor structure body 10 further includes a fifth outer edge 10E that is connected to the first outer edge 10A and the fourth outer edge 10D, and a sixth outer edge 10F that is connected to the second outer edge 10B and the third outer edge 10C. For example, the fifth outer edge 10E and the sixth outer edge 10F have curved shapes concave toward the center of the semiconductor structure body 10 in a plan view.

The semiconductor structure body 10 includes a first surface 10a. The first surface 10a is a surface of the n-side layer 11. The light from the active layer 12 is extracted out of the light-emitting element 1 mainly through the first surface 10a. The n-side layer 11 includes a plurality of first regions 11a. The plurality of first regions 11a are positioned on a side opposite to the first surface 10a in the first direction d1. The plurality of first regions 11a are exposed from the active layer 12 and the p-side layer 13.

The n-side layer 11 further includes a second region 11b that is positioned on the side opposite to the first surface 10a in the first direction d1 and is exposed from the active layer 12 and the p-side layer 13. In a plan view, the second region 11b is positioned at an outer perimeter portion of the n-side layer 11 and surrounds the region in which the active layer 12, the p-side layer 13, and the first region 11a are located.

First p-Side Electrode

As shown in FIG. 1, the light-emitting element 1 further includes a first p-side electrode 21 that is located outside the semiconductor structure body 10 in a plan view. For example, the first p-side electrode 21 is located at a position proximate to the fifth outer edge 10E of the semiconductor structure body 10 in a plan view.

The first p-side electrode 21 includes, for example, at least one metal selected from the group consisting of titanium (Ti), platinum (Pt), and gold (Au). The thickness of the first p-side electrode 21 can be, for example, not less than 0.1 μm and not more than 1.2 μm.

Second p-Side Electrode

The light-emitting element 1 further includes a second p-side electrode 22. As shown in FIG. 2, the second p-side electrode 22 is located at a side of a surface 13a of the p-side layer 13 opposite to a surface thereof at which the active layer 12 is located in the first direction d1. For example, the second p-side electrode 22 is directly in contact with the surface 13a of the p-side layer 13 and is electrically connected with the p-side layer 13.

It is preferable for the second p-side electrode 22 to have a high reflectance for light emitted from the active layer 12. The expression that "the second p-side electrode 22 has a high reflectance for light emitted by the active layer 12" means that the second p-side electrode 22 has a reflectance of not less than 70%, and preferably not less than 80% for the wavelength of the light from the active layer 12. The second p-side electrode 22 is, for example, a metal layer containing silver (Ag). When light emitted from the active layer 12 toward the second p-side electrode 22 is reflected at the second p-side electrode 22 toward the first surface 10a, the light extraction efficiency from the first surface 10a can be increased. The thickness of the second p-side electrode 22 can be, for example, not less than 0.1 μm and not more than 3 μm.

p-Side Wiring Layer

The light-emitting element 1 further includes a p-side wiring layer 40. As shown in FIG. 2, the second p-side electrode 22 is positioned between the p-side layer 13 and the p-side wiring layer 40 in the first direction d1.

The p-side wiring layer 40 includes a first p-side connection portion 41 that is connected with the first p-side electrode 21, and second p-side connection portions 42 that are connected with the second p-side electrode 22. The p-side layer 13 is electrically connected with the first p-side electrode 21 via the second p-side electrode 22 and the p-side wiring layer 40. The p-side wiring layer 40 is, for example, a metal layer including at least one of aluminum (Al), copper (Cu), Ti, rhodium (Rh), ruthenium (Ru), or Pt. The thickness of the p-side wiring layer 40 can be, for example, not less than 0.1 μm and not more than 3 μm.

n-Side Wiring Layer

The light-emitting element 1 further includes an n-side wiring layer 50. The n-side wiring layer 50 includes a plurality of first n-side connection portions 51 that are connected to the plurality of first regions 11a of the n-side layer 11. The n-side layer 11 is electrically connected with the n-side wiring layer 50 at the first regions 11a. The n-side wiring layer 50 is, for example, a metal layer including at least one of Ti, Al, silicon (Si), or Cu. For example, the same material as that of the p-side wiring layer 40 also can be used as the material of the n-side wiring layer 50. The thickness of the n-side wiring layer 50 can be, for example, not less than 0.1 μm and not more than 3 μm.

In FIG. 1, the first regions 11a are indicated by broken-line circles; and the first n-side connection portions 51 of the n-side wiring layer 50 are illustrated by broken-line circles each positioned inside a respective one of the first regions 11a. In FIG. 1, the second p-side connection portions 42 at which the p-side wiring layer 40 and the second p-side electrode 22 are connected is indicated by cross-hatching regions. The shapes of the first region 11a, the first n-side connection portion 51, and the second p-side connection portions 42 in a plan view are not limited to circles.

In the driving state in which light emission is caused by supplying a current to the light-emitting element 1, concentration of a current easily occur at the first p-side connection portion 41 at which the first p-side electrode 21 and the p-side wiring layer 40 are connected, which easily causes heat generation. Also, in the driving state of the light-emitting element 1, concentration of a current easily occur also at the second p-side connection portion 42 at which the p-side wiring layer 40 and the p-side layer 13 are connected via the second p-side electrode 22, which also easily causes heat generation. Accordingly, if the first p-side connection portion 41, which easily generates heat, and the second p-side connection portions 42, which easily generate heat, are proximate to each other, wiring and/or the semiconductor structure body 10 positioned at the periphery of portions connected with the second p-side connection portion 42 proximate to the first p-side connection portion 41 would be easily damaged by the heat.

According to the present embodiment, as shown in FIG. 1, the shortest distance between the first p-side electrode 21 and the second p-side connection portion 42 is greater than the shortest distance between the first p-side electrode 21 and a first n-side connection portion 51a (the closest one) of the plurality of first n-side connection portions 51 most proximate to the first p-side electrode 21 among the plurality of first n-side connection portions 51 in a plan view.

With this structure, the concentration of the current at the portion of the semiconductor structure body 10 proximate to the first p-side electrode 21 can be reduced, so that the reliability of the light-emitting element 1 can be increased. To reduce the concentration of the current at the portion of the semiconductor structure body 10 proximate to the first p-side electrode 21, it is preferable for the shortest distance between the first p-side electrode 21 and the second p-side connection portion 42 in a plan view to be, for example, not less than 100 μm and not more than 500 μm. Also, according to the embodiment, the distance can be increased between the first p-side connection portion 41 and the second p-side connection portion 42, which are regions in the semiconductor structure body 10 that easily generate heat. Thus, the damage of the semiconductor structure body 10 due to the heat can be reduced, and the reliability of the light-emitting element 1 can be increased. The semiconductor structure body 10 that includes the active layer 12 emitting light having a peak wavelength in the ultraviolet region generates heat more easily than the semiconductor structure body that includes the active layer 12 emitting light having a longer peak wavelength than the ultraviolet region. This is because, in many cases, the semiconductor structure body 10 that includes the active layer 12 emitting light having a peak wavelength in the ultraviolet region uses a semiconductor layer having a high Al content ratio with respect to Ga, and there is a tendency for the internal quantum efficiency to be reduced. However, according to the embodiment, the reliability of the light-emitting element 1 can be the increased even when the active layer 12 emits light having a peak wavelength in the ultraviolet region. Light in the ultraviolet region refers to, for example, light having a peak wavelength of not less than 210 nm and not more than 410 nm.

A current is supplied to the p-side layer 13 and the active layer 12 via the second p-side electrode 22. As described above, the second p-side electrode 22 also functions as a reflective layer. Accordingly, to reduce the bias of the current density distribution and to increase the reflecting area toward the first surface 10a side, it is preferable to provide the second p-side electrode 22 over a wide region of the surface 13a of the p-side layer 13. For example, it is preferable for the coverage of the second p-side electrode 22 on the surface 13a of the p-side layer 13 to be not less than 70%, and more favorably not less than 80%. In FIG. 1, the outer edge of the second p-side electrode 22 is illustrated by a broken line. As shown in FIG. 1, it is preferable for the second p-side electrode 22 to be located in at least the region between the first p-side electrode 21 and the first n-side connection portion 51a among the plurality of first n-side connection portions 51 most proximate to the first p-side electrode 21 in a plan view.

In the example shown in FIG. 1, a plurality of second p-side connection portions 42 are positioned to be separated from each other in a plan view. The concentration of the current can be reduced thereby. The shortest distance between the first p-side electrode 21 and a second p-side connection portion 42a among the plurality of second p-side connection portions 42 most proximate to the first p-side electrode 21 is greater than the shortest distance between the first p-side electrode 21 and the first n-side connection portion 51a among the plurality of first n-side connection portions 51 most proximate to the first p-side electrode 21 in a plan view.

To reduce the concentration of the current, it is preferable that at least one second p-side connection portion 42 is located between respective adjacent ones of the plurality of first n-side connection portions 51 in a plan view. For example, the first n-side connection portion 51a and the second p-side connection portion 42 are alternately arranged in the direction from the first p-side electrode 21 toward a first n-side electrode 31 described below in a plan view.

The second p-side connection portion 42 is positioned at least in a region including the center of the semiconductor structure body 10 in a plan view. Accordingly, the region that includes the center of the light-emitting element 1 in a plan view can have a relatively strong light emission; and the optical design of a light-emitting device that uses the light-emitting element 1 is easier.

It is preferable for the area of the second p-side connection portion 42 in a plan view to be not less than 10% and not more than 90%, and more favorably not less than 30% and not more than 70% of the area of the p-side layer 13 in a plan view. By setting the area of the second p-side connection portion 42 in a plan view to such values, the distance between the first p-side connection portion 41 and the second p-side connection portion 42 can be moderate, and the forward voltage can be reduced by ensuring the connection area between the second p-side electrode 22 and the p-side wiring layer 40 while increasing the reliability by reducing the concentration of the current at the portion proximate to the first p-side electrode 21. When the plurality of second p-side connection portions 42 are positioned to be separated from each other, the area of the second p-side connection portion 42 is the total area of the plurality of second p-side connection portions 42. The area of the p-side layer 13 is the area of the surface 13a at which the second p-side electrode 22 is located.

The light-emitting element 1 can further include the following configuration.

First Insulating Film

As shown in FIG. 2, a first insulating film 71 covers the second p-side electrode 22 and the surface 13a of the p-side layer 13. The thickness of the first insulating film 71 can be, for example, not less than 0.01 μm and not more than 1.5 μm.

Second Insulating Film

A second insulating film 72 is positioned between the semiconductor structure body 10 and the p-side wiring layer 40 in the first direction d1. The second insulating film 72 covers the surface of the semiconductor structure body 10 positioned on the side opposite to the first surface 10a in the first direction d1. The second insulating film 72 also covers the first insulating film 71. The thickness of the second insulating film 72 can be, for example, not less than 0.1 μm and not more than 2 μm.

The second p-side connection portion 42 of the p-side wiring layer 40 is connected to the second p-side electrode 22 in an opening provided in the first insulating film 71 and an opening provided in the second insulating film 72.

As shown in FIG. 1, the second insulating film 72 includes a first portion 72a positioned outward of the fifth outer edge 10E of the semiconductor structure body 10 and a second portion 72b positioned outward of the sixth outer edge 10F of the semiconductor structure body 10 in a plan view. As shown in FIG. 2, the first p-side electrode 21 is connected with the first p-side connection portion 41 of the p-side wiring layer 40 in an opening provided in the first portion 72a of the second insulating film 72.

Third Insulating Film

A third insulating film 73 is positioned between the p-side wiring layer 40 and the n-side wiring layer 50 in the first direction d1. The thickness of the third insulating film 73 can be, for example, not less than 0.1 μm and not more than 2 μm.

The first insulating film 71, the second insulating film 72, and the third insulating film 73 are, for example, silicon oxide films or silicon nitride films. The first insulating film 71, the second insulating film 72, and the third insulating film 73 each may have single-layer structures or may have stacked structures in which a plurality of insulating layers are stacked.

The first n-side connection portion 51 of the n-side wiring layer 50 is connected with the first region 11a of the n-side layer 11 in an opening provided in the third insulating film 73, the p-side wiring layer 40, the second insulating film 72, the first insulating film 71, and the second p-side electrode 22 in a plan view.

First n-Side Electrode

The first n-side electrode 31 is located outside the semiconductor structure body 10 in a plan view and is connected with the n-side wiring layer 50. As shown in FIG. 1, the first n-side electrode 31 is located at a position proximate to the sixth outer edge 10F of the semiconductor structure body 10 in a plan view. For example, the same material as the first p-side electrode 21 can be used as the material of the first n-side electrode 31. The first p-side electrode 21 is positioned proximate to one corner of the quadrilateral light-emitting element 1 in a plan view. The first n-side electrode 31 is positioned proximate to the corner facing the corner proximate to the position of the first p-side electrode 21. The first p-side electrode 21 and the first n-side electrode 31 are located on a diagonal line of the light-emitting element 1 in a plan view. The thickness of the first n-side electrode 31 can be, for example, not less than 0.1 μm and not more than 1.2 μm.

As shown in FIG. 2, the n-side wiring layer 50 includes a second n-side connection portion 52 connected with the first n-side electrode 31. For example, the second n-side connection portion 52 is connected with the first n-side electrode 31 via a conductive layer 60. The conductive layer 60 is positioned between the first n-side electrode 31 and the second n-side connection portion 52. The same material as the p-side wiring layer 40 can be used as the material of the conductive layer 60. The thickness of the conductive layer 60 can be, for example, not less than 0.1 μm and not more than 3 μm.

The first n-side electrode 31 is connected with the conductive layer 60 in an opening provided in the second portion 72b of the second insulating film 72. The second n-side connection portion 52 of the n-side wiring layer 50 may be directly connected with the first n-side electrode 31.

Substrate

A substrate 100 is positioned on the side of the semiconductor structure body 10 opposite to the first surface 10a in the first direction d1 and supports the configuration of the light-emitting element 1 described above. The substrate 100 is, for example, a silicon substrate.

Bonding Layer

For example, the substrate 100 and the n-side wiring layer 50 are bonded by a bonding layer 110. The bonding layer 110 is, for example, a metal layer including Ti, nickel (Ni), tin (Sn), Al, Cu, Pt, Au, etc. The thickness of the bonding layer 110 can be, for example, not less than 2 μm and not more than 30 μm.

The light-emitting element 1 is electrically connected with a power supply circuit via the first p-side electrode 21 and the first n-side electrode 31. When the substrate 100 and the bonding layer 110 are conductive, the n-side wiring layer 50 may be electrically connected with the power supply circuit via the bonding layer 110 and the substrate 100 without providing the first n-side electrode 31.

Also, the light-emitting element 1 can include a protective film 90 that covers the first surface 10a and side surface of the semiconductor structure body 10. The light extraction efficiency from the first surface 10a can be increased by roughening the first surface 10a to provide a plurality of protrusions.

Other embodiments will now be described with reference to plan views similar to FIG. 1. The light-emitting elements of the other embodiments also have cross-sectional structures similar to the cross-sectional structure of the light-emitting element 1 of the first embodiment shown in FIG. 2. The matters described in the first embodiment are applied to the other embodiments as well, except for inconsistencies of the description and drawings of the other embodiments. In FIGS. 3 to 9 showing the other embodiments as well, similarly to FIG. 1, the second p-side connection portion 42 at which the p-side wiring layer 40 and the second p-side electrode 22 are connected is illustrated by cross hatching regions.

Second Embodiment

Figure 3:
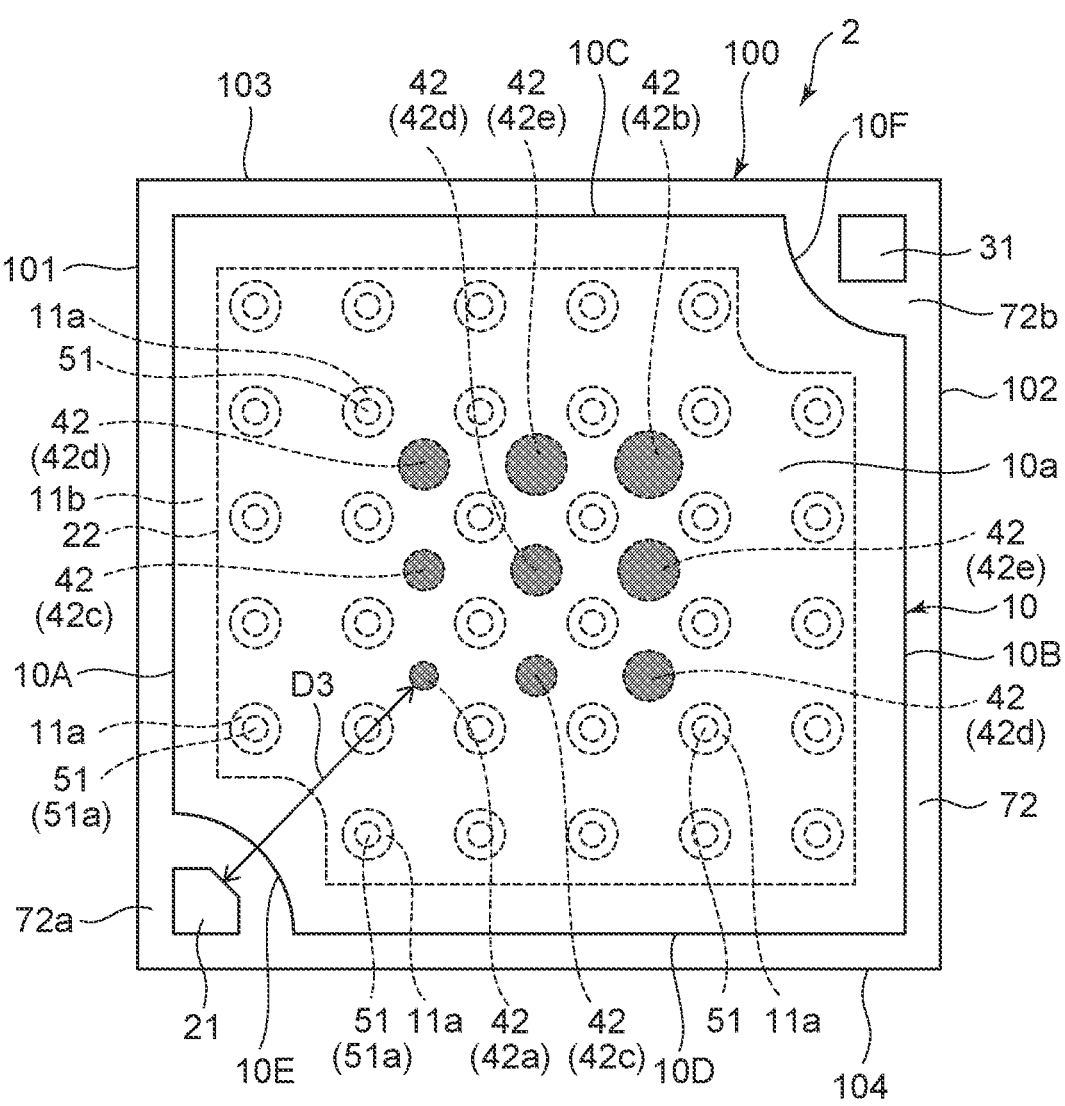
FIG. 3 is a schematic plan view of a light-emitting element of a second embodiment.

According to a light-emitting element 2 of a second embodiment as shown in FIG. 3, the area of the second p-side connection portion 42a of the plurality of second p-side connection portions 42 that is positioned at a third distance D3 from the first p-side electrode 21 is less than the area of the second p-side connection portion 42 of the plurality of second p-side connection portions 42 that is positioned at a fourth distance from the first p-side electrode 21 in a plan view, the fourth distance being greater than the third distance D3, each of the third distance D3 and the fourth distance being the shortest distance between the first p-side electrode 21 and a respective one of the second p-side connection portions 42, the third distance D3 being the shortest of the shortest distances between the first p-side electrode 21 and respective second p-side connection portions 42 of the plurality of second p-side connection portions 42.

Accordingly, the forward voltage can be reduced by ensuring a sufficient connection area between the second p-side connection portion 42 and the p-side layer 13 while increasing the reliability by reducing the concentration of the current at the portion proximate to the first p-side electrode 21.

In the example shown in FIG. 3, the areas of the second p-side connection portions 42 more proximate to the first p-side electrode 21 than the first n-side electrode 31 are less than the areas of the second p-side connection portions 42 more proximate to the first n-side electrode 31 than the first p-side electrode 21 in a plan view. In a plan view, the areas of the plurality of second p-side connection portions 42 arranged on a first axis, which connects the first p-side electrode 21 and the first n-side electrode 31 with the shortest distance, are smaller closer to the first p-side electrode 21.

A second p-side connection portion 42b is positioned so that the shortest distance between the first p-side electrode 21 and the second p-side connection portion 42b is the longest distance among the shortest distances respectively between the first p-side electrode 21 and the plurality of second p-side connection portions 42 and so that the shortest distance between the first n-side electrode 31 and the second p-side connection portion 42b is the shortest distance among the shortest distances respectively between the first n-side electrode 31 and the plurality of second p-side connection portions 42 in a plan view. The area of the second p-side connection portion 42b is the largest among the plurality of second p-side connection portions 42 in a plan view. By setting the area of the second p-side connection portion 42b to the largest among the plurality of second p-side connection portions 42 in a plan view, current is easily supplied to regions separated from the first p-side electrode 21.

In a plan view, a plurality of second p-side connection portions 42c, a plurality of second p-side connection portions 42d, and a plurality of second p-side connection portions 42e are located at distances from the first p-side electrode 21 so that the shortest distances from the first p-side electrode 21 each are greater than the third distance D3 and less than the shortest distance between the first p-side electrode 21 and the second p-side connection portion 42b.

The shortest distance between the first p-side electrode 21 and the second p-side connection portion 42c is greater than the third distance D3 and less than the shortest distance between the first p-side electrode 21 and the second p-side connection portion 42b in a plan view. The area of the second p-side connection portion 42c is greater than the area of the second p-side connection portion 42a and less than the area of the second p-side connection portion 42b in a plan view.

The shortest distance between the first p-side electrode 21 and the second p-side connection portion 42d is greater than the shortest distance between the first p-side electrode 21 and the second p-side connection portion 42c and less than the shortest distance between the first p-side electrode 21 and the second p-side connection portion 42b in a plan view. The area of the second p-side connection portion 42d is greater than the area of the second p-side connection portion 42c and less than the area of the second p-side connection portion 42b in a plan view.

The shortest distance between the first p-side electrode 21 and the second p-side connection portion 42e is greater than the shortest distance between the first p-side electrode 21 and the second p-side connection portion 42d and less than the shortest distance between the first p-side electrode 21 and the second p-side connection portion 42b in a plan view. The area of the second p-side connection portion 42e is greater than the area of the second p-side connection portion 42d and less than the area of the second p-side connection portion 42b in a plan view. By setting the areas of the second p-side connection portions 42 in this manner, the concentration of the current in the semiconductor structure body 10 proximate to the first p-side electrode 21 can be reduced because the areas of the second p-side connection portions 42 increase away from the first p-side electrode 21.

Third to seventh embodiments will now be described with reference respectively to FIGS. 4 to 8.

According to the third to seventh embodiments, the p-side wiring layer 40 includes a plurality of first openings 43 in a plan view. Each first opening 43 overlaps the first region 11a of the n-side layer 11 and the first n-side connection portion 51 of the n-side wiring layer 50 connected to the first region 11a in a plan view. Also, the first opening 43 overlaps an opening of the third insulating film 73, an opening of the second insulating film 72, an opening of the first insulating film 71, and an opening of the second p-side electrode 22. The second p-side connection portion 42 of the p-side wiring layer 40 surrounds the plurality of first openings 43 in a plan view.

Third Embodiment

Figure 4:
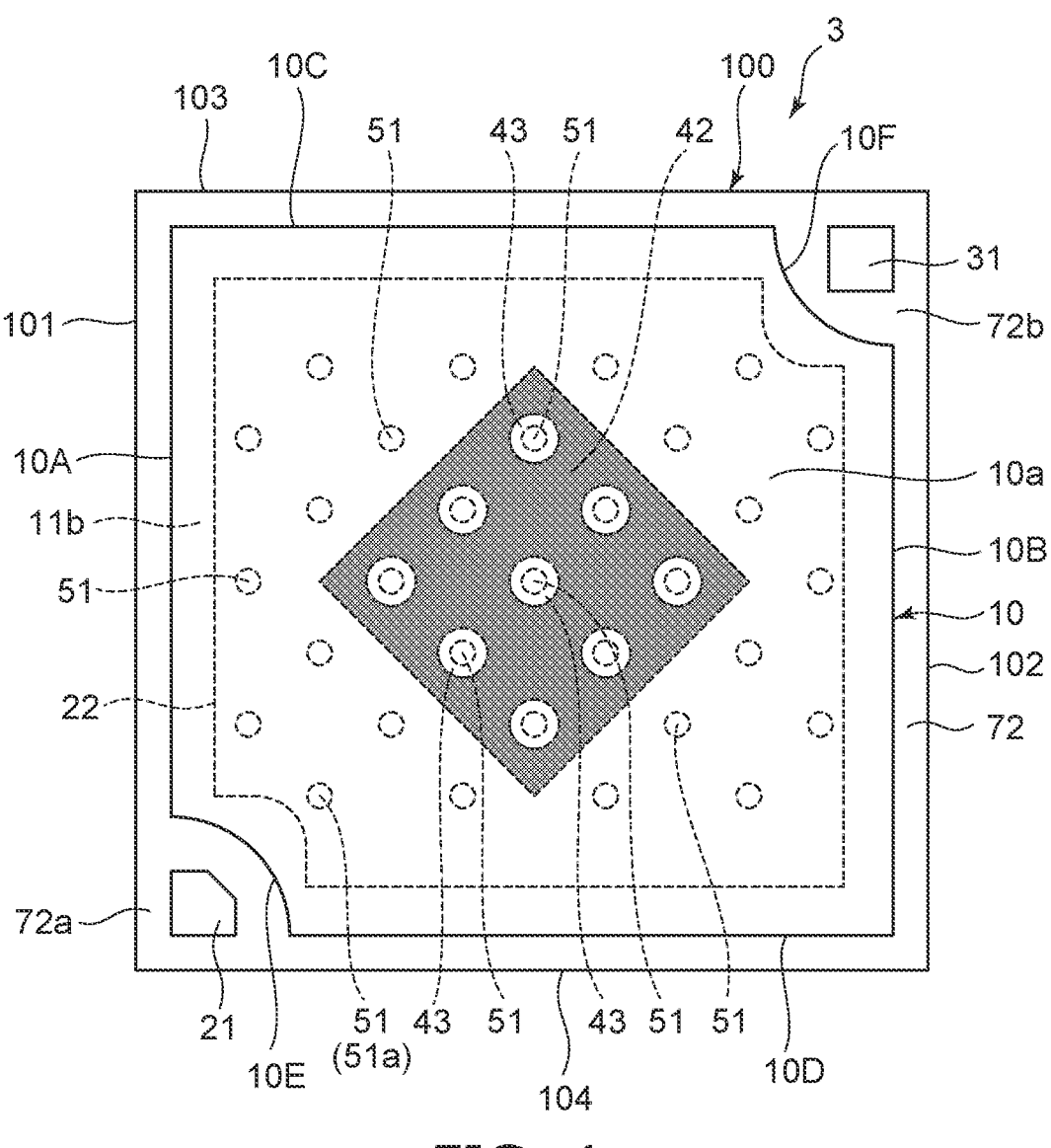
FIG. 4 is a schematic plan view of a light-emitting element of a third embodiment.

In a light-emitting element 3 of the third embodiment as shown in FIG. 4, the second p-side connection portion 42 is positioned in a region including the center of the semiconductor structure body 10 in a plan view. The shortest distance between the first p-side electrode 21 and the second p-side connection portion 42 is equal to the shortest distance between the first n-side electrode 31 and the second p-side connection portion 42 in a plan view. Here, the shortest distance between the first p-side electrode 21 and the second p-side connection portion 42 being equal to the shortest distance between the first n-side electrode 31 and the second p-side connection portion 42 means that the difference between the shortest distance between the first p-side electrode 21 and the second p-side connection portion 42 and the shortest distance between the first n-side electrode 31 and the second p-side connection portion 42 is not more than 5 μm. Accordingly, the region including the center of the light-emitting element 3 in a plan view can have a relatively strong light emission while increasing the distance between the first p-side connection portion 41 and the second p-side connection portion 42 which are regions that easily generate heat; and the optical design of a light-emitting device that uses the light-emitting element 3 is easier.

Fourth Embodiment

Figure 5:
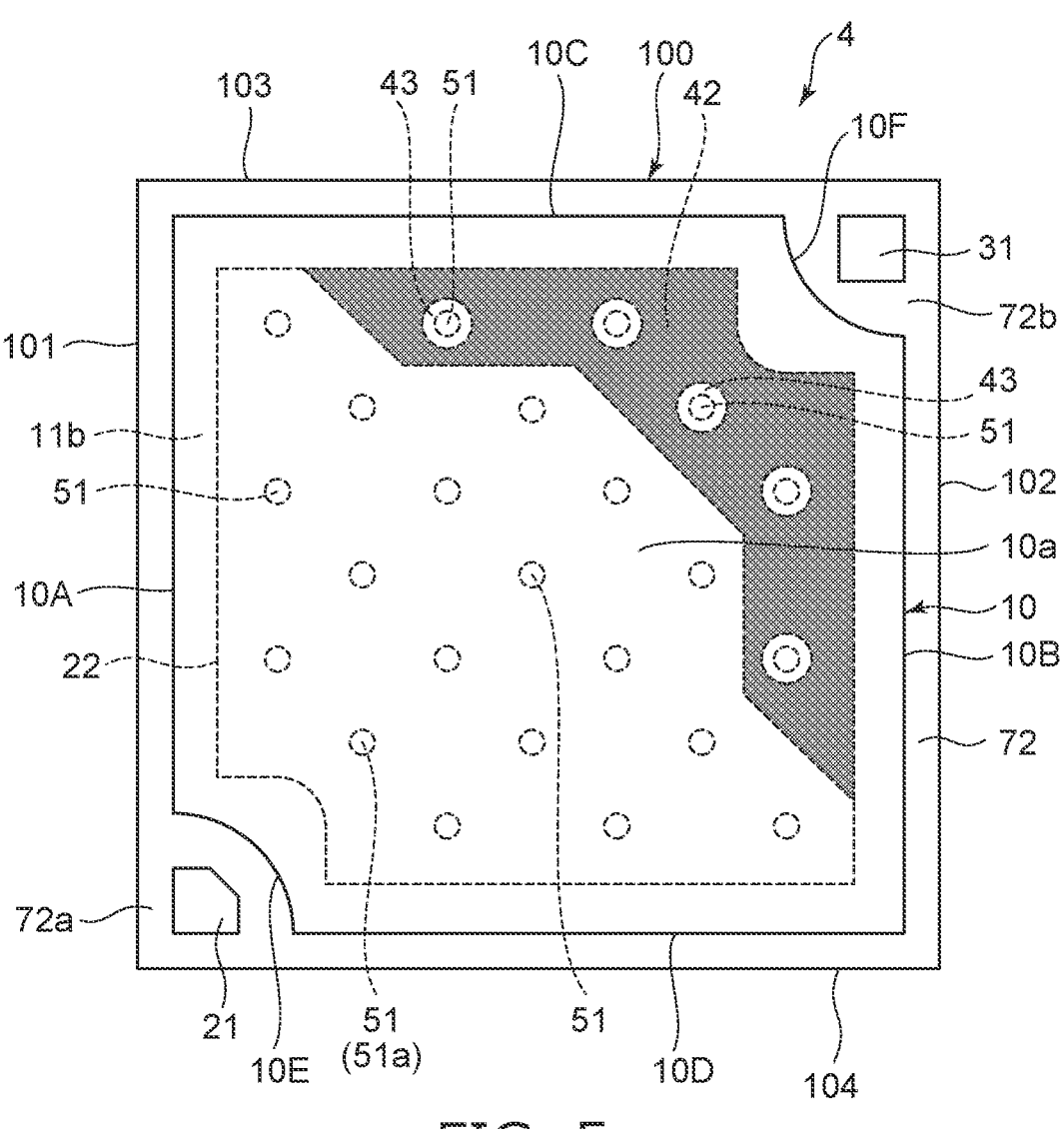
FIG. 5 is a schematic plan view of a light-emitting element of a fourth embodiment.

In a light-emitting element 4 of the fourth embodiment as shown in FIG. 5, the shortest distance between the first p-side electrode 21 and the second p-side connection portion 42 is greater than the shortest distance between the first n-side electrode 31 and the second p-side connection portion 42 in a plan view. Also, according to the embodiment, the shortest distance between the first p-side electrode 21 and the second p-side connection portion 42 is greater than that of the third embodiment in a plan view. Accordingly, compared with the third embodiment, the concentration of the current at the portion of the semiconductor structure body 10 proximate to the first p-side electrode 21 can be reduced, and the reliability of the light-emitting element 4 can be increased. Compared with the third embodiment, the distance can be increased between the first p-side connection portion 41 and the second p-side connection portion 42 which are regions that easily generate heat; and the reliability of the light-emitting element 4 can be increased.

Fifth Embodiment

Figure 6:
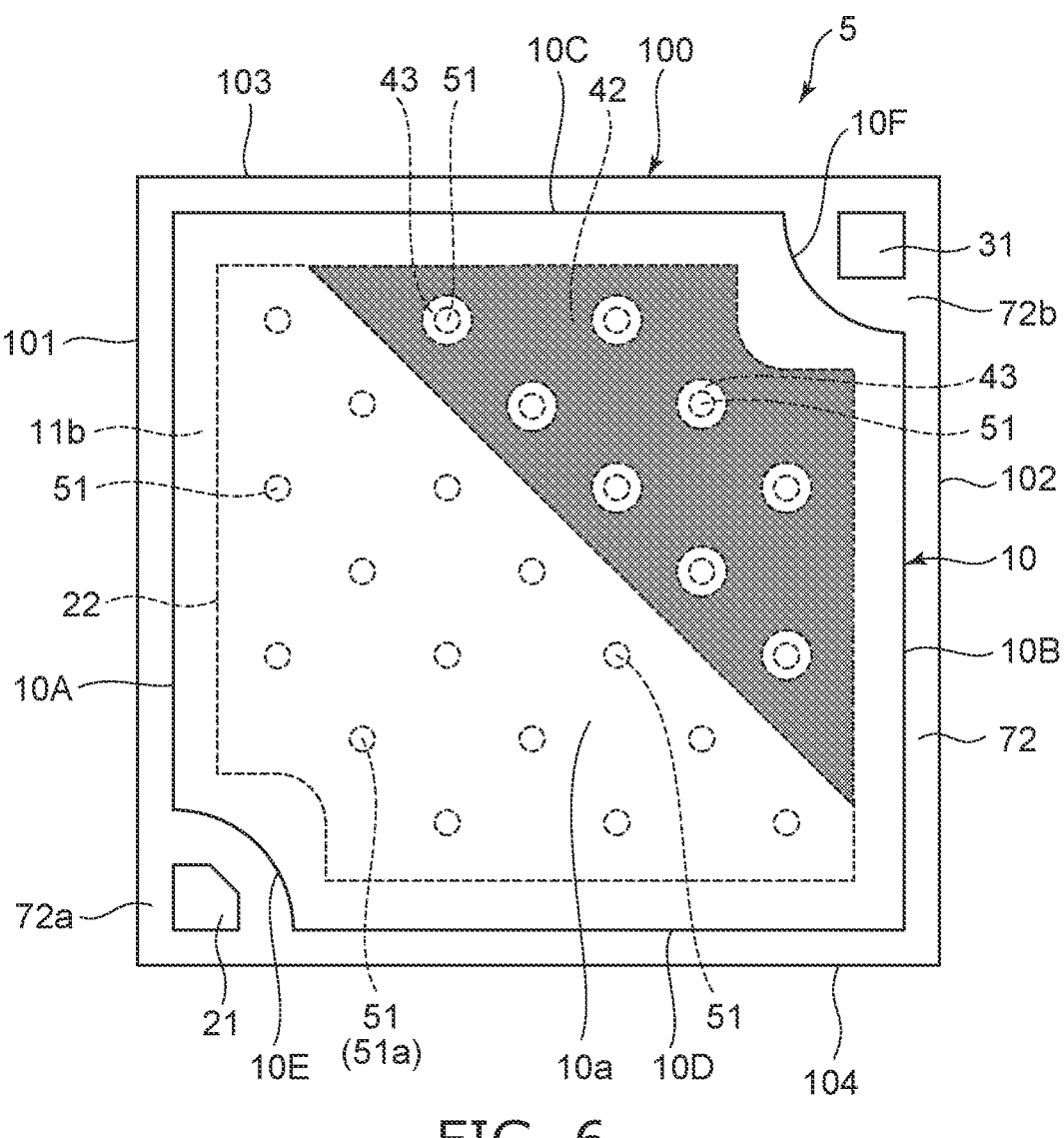
FIG. 6 is a schematic plan view of a light-emitting element of a fifth embodiment.

In a light-emitting element 5 of the fifth embodiment as shown in FIG. 6, the shortest distance between the first p-side electrode 21 and the second p-side connection portion 42 is greater than the shortest distance between the first n-side electrode 31 and the second p-side connection portion 42 in a plan view. The area of the second p-side connection portion 42 is greater than that of the fourth embodiment in a plan view. According to the embodiment, the area of the second p-side connection portion 42 in a plan view is not less than 20% and not more than 40% of the area of the p-side layer 13 in a plan view. Accordingly, compared with the third embodiment, the concentration of the current at the portion of the semiconductor structure body 10 proximate to the first p-side electrode 21 can be reduced, and the reliability of the light-emitting element 5 can be increased. Compared with the third embodiment, the distance can be increased between the first p-side connection portion 41 and the second p-side connection portion 42 which are regions that easily generate heat; and the reliability of the light-emitting element 5 can be increased. Compared with the fourth embodiment, the forward voltage can be reduced because the connection area between the second p-side electrode 22 and the p-side wiring layer 40 is large.

Sixth Embodiment

Figure 7:
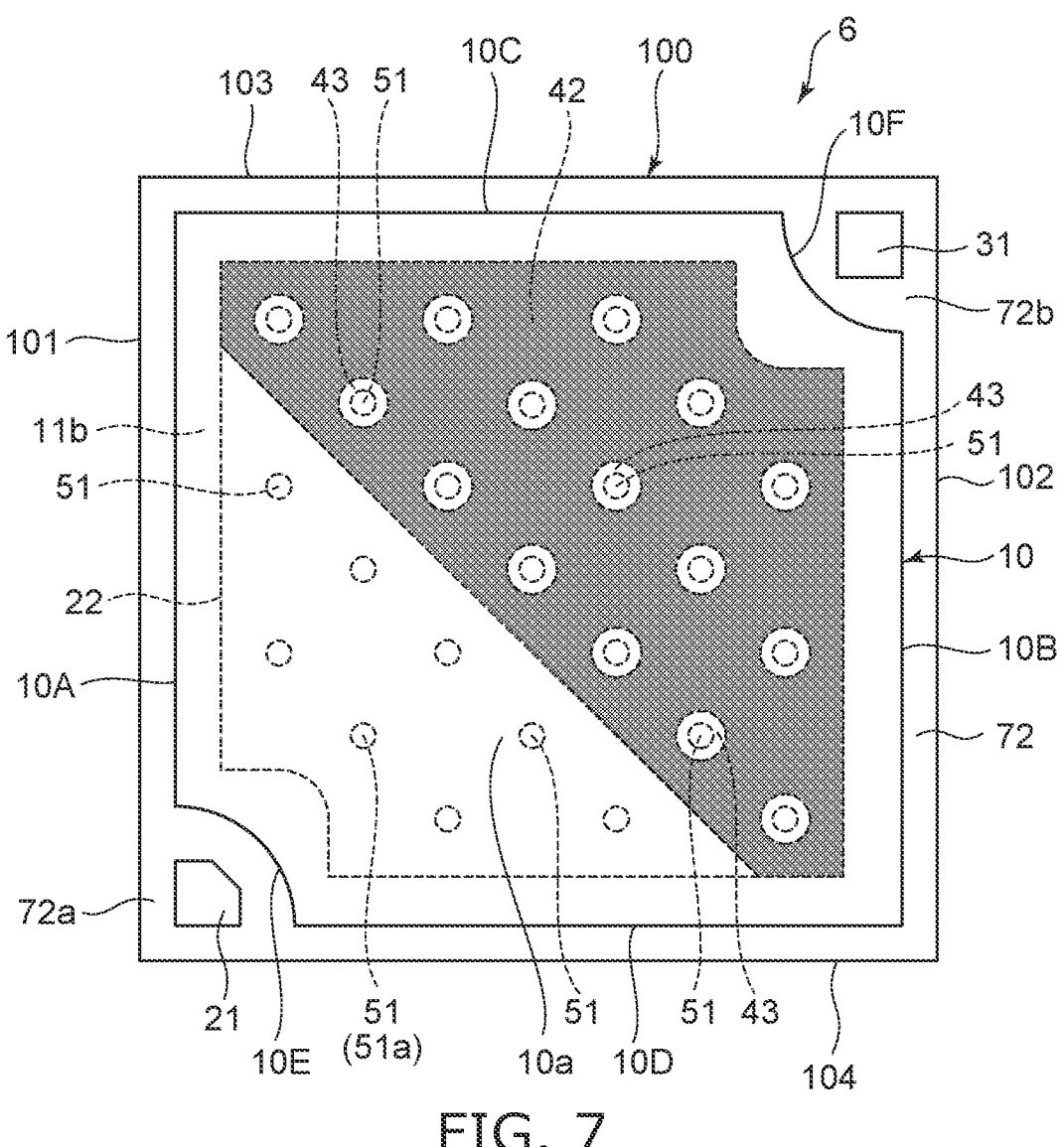
FIG. 7 is a schematic plan view of a light-emitting element of a sixth embodiment.

In a light-emitting element 6 of the sixth embodiment as shown in FIG. 7, the shortest distance between the first p-side electrode 21 and the second p-side connection portion 42 is greater than the shortest distance between the first n-side electrode 31 and the second p-side connection portion 42 in a plan view. The second p-side connection portion 42 is positioned in a region including the center of the semiconductor structure body 10 in a plan view. The area of the second p-side connection portion 42 is greater than that of the fifth embodiment in a plan view. According to the embodiment, the area of the second p-side connection portion 42 in a plan view is not less than 50% and not more than 70% of the area of the p-side layer 13 in a plan view. Accordingly, compared with the third embodiment, the concentration of the current at the portion of the semiconductor structure body 10 proximate to the first p-side electrode 21 can be reduced, and the reliability of the light-emitting element 6 can be increased. Also, compared with the fifth embodiment, the forward voltage can be reduced because the connection area between the second p-side electrode 22 and the p-side wiring layer 40 is large.

Seventh Embodiment

Figure 8:
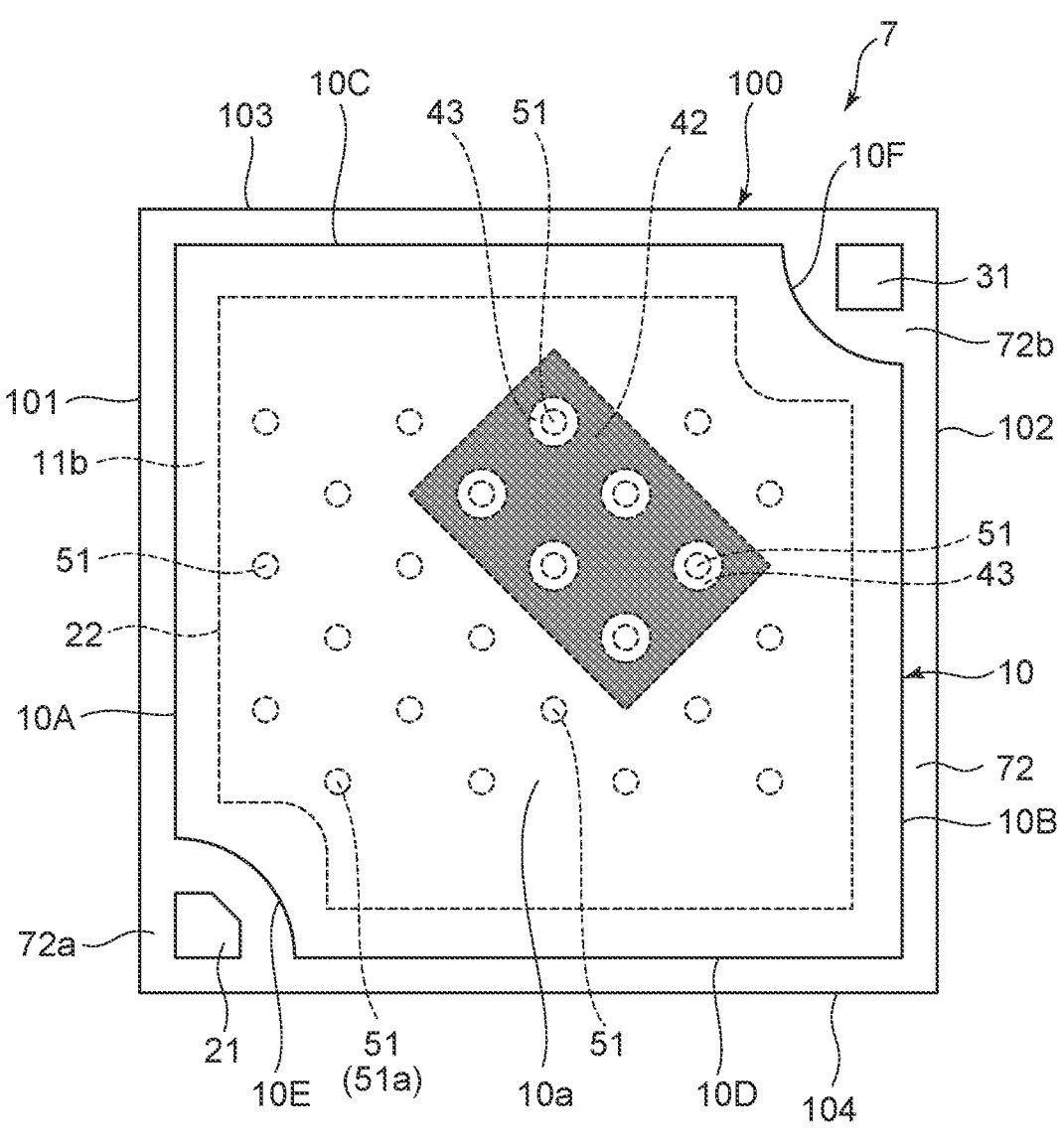
FIG. 8 is a schematic plan view of a light-emitting element of a seventh embodiment.

In a light-emitting element 7 of the seventh embodiment as shown in FIG. 8, the shortest distance between the first p-side electrode 21 and the second p-side connection portion 42 is greater than the shortest distance between the first n-side electrode 31 and the second p-side connection portion 42 in a plan view. According to the embodiment, the shortest distance between the first p-side electrode 21 and the second p-side connection portion 42 is greater than that of the third embodiment in a plan view. Accordingly, compared with the third embodiment, the concentration of the current at the portion of the semiconductor structure body 10 proximate to the first p-side electrode 21 can be reduced, and the reliability of the light-emitting element 7 can be increased. Compared with the third embodiment, the distance can be increased between the first p-side connection portion 41 and the second p-side connection portion 42 which are regions that easily generate heat; and the reliability of the light-emitting element 7 can be increased. Also, according to the embodiment, the shortest distance between the first p-side electrode 21 and the first n-side electrode 31 is greater than that of the fourth embodiment in a plan view. Accordingly, compared with the fourth embodiment, the region that includes the center of the light-emitting element 7 in a plan view can have a relatively strong light emission; and the optical design of a light-emitting device that uses the light-emitting element 7 is easier. The second p-side connection portion 42 is positioned in the region including the center of the semiconductor structure body 10 in a plan view.

Eighth Embodiment

A light-emitting element 8 of an eighth embodiment will now be described with reference to FIG. 9.

According to the light-emitting element 8 of the eighth embodiment, the p-side wiring layer 40 includes the plurality of first openings 43 overlapping the plurality of first regions 11*a* of the n-side layer 11 in a plan view. Also, the first openings 43 overlap the first n-side connection portions 51 of the n-side wiring layer 50 connected to the first region 11*a* in a plan view. The first openings 43 also overlap openings of the third insulating film 73, openings of the second insulating film 72, openings of the first insulating film 71, and openings of the second p-side electrode 22 in a plan view.

In the p-side wiring layer 40, the outer edge of the second p-side connection portion 42 connected with the second p-side electrode 22 is positioned inward of the outer edge of the second p-side electrode 22 and extends along the outer edge of the second p-side electrode 22 in a plan view.

The area of a first opening 43*a* of the plurality of first openings 43 that is positioned at a first distance from the first p-side electrode 21 is greater than the area of a first opening 43 of the plurality of first openings 43 that is positioned at a second distance from the first p-side electrode 21 in a plan view, the second distance being greater than the first distance, each of the first distance and the second distance being the shortest distance between the first p-side electrode 21 and a respective one of the first openings 43, the first distance being the shortest of the shortest distances between the first p-side electrode 21 and respective first openings 43 of the plurality of first openings 43.

With this structure, the concentration of the current at the portion of the semiconductor structure body 10 proximate to the first p-side electrode 21 can be reduced thereby, and the reliability of the light-emitting element 8 can be increased.

Figure 9:
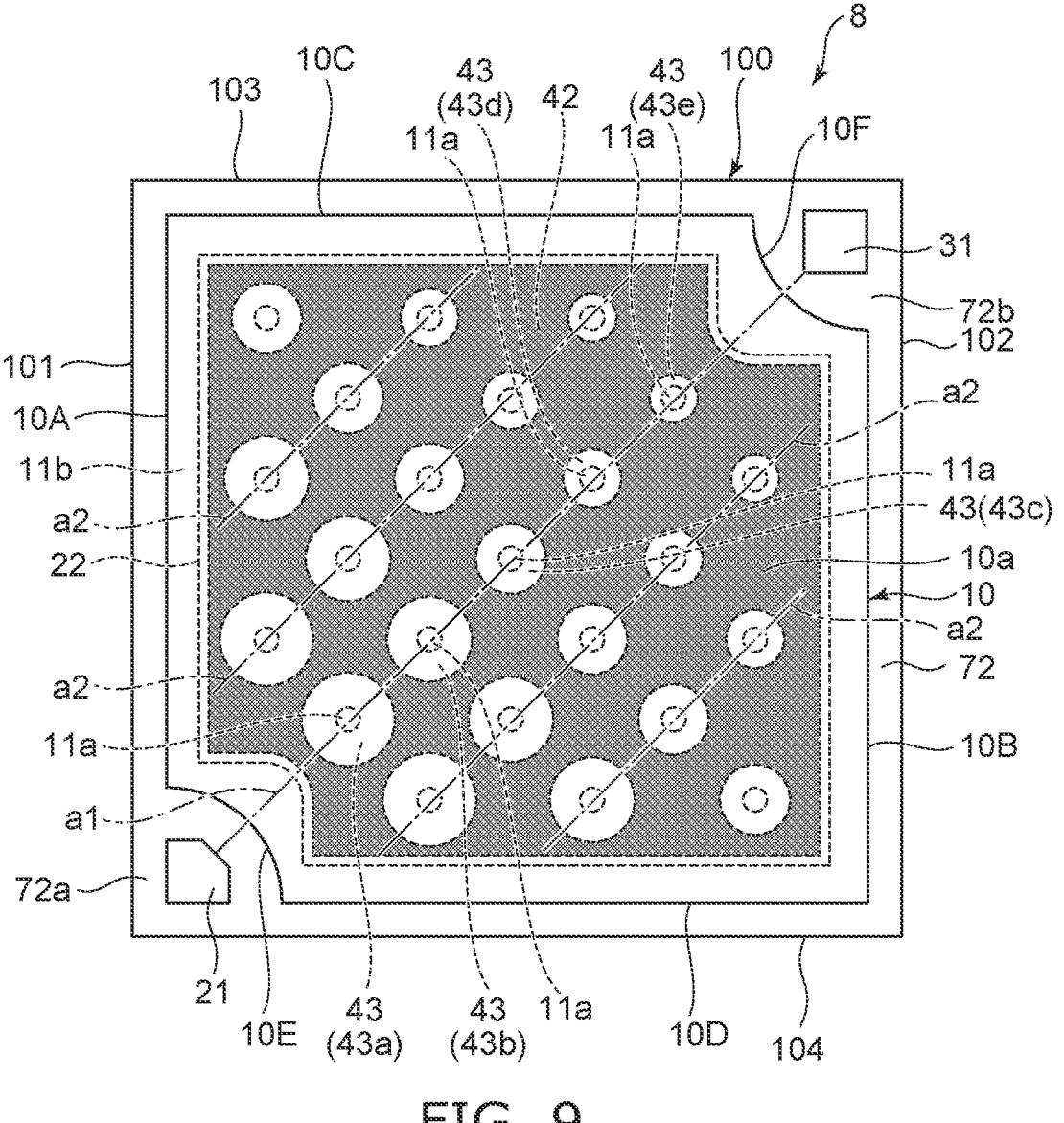
FIG. 9 is a schematic plan view of a light-emitting element of an eighth embodiment.

In the example shown in FIG. 9, the areas of the first openings 43 more proximate to the first p-side electrode 21 than the first n-side electrode 31 are greater than the areas of the first openings 43 more proximate to the first n-side electrode 31 than the first p-side electrode 21 in a plan view. The plurality of first openings 43 that have mutually-different areas are arranged on a first axis a1 connecting the first p-side electrode 21 and the first n-side electrode 31 with the shortest distance in a plan view. The areas of the plurality of first openings 43 arranged on the first axis a1 are greater closer to the first p-side electrode 21. Accordingly, the forward voltage can be reduced by ensuring a sufficient connection area between the second p-side connection portion 42 and the p-side layer 13 while increasing the reliability by reducing the current concentration by reducing the area of the second p-side connection portion 42 at the portion proximate to the first p-side electrode 21.

For example, the first opening 43*a*, a first opening 43*b*, a first opening 43*c*, a first opening 43*d*, and a first opening 43*e* are arranged in this order from the first p-side electrode 21 toward the first n-side electrode 31 on the first axis a1. The area of the first opening 43*a* is greater than the area of the first opening 43*b*. The area of the first opening 43*b* is greater than the area of the first opening 43*c*. The area of the first opening 43*c* is greater than the area of the first opening 43*d*. The area of the first opening 43*d* is greater than the area of the first opening 43*e*. The diameter of the first opening 43*a* is, for example, not less than 130 μm and not more than 160 μm. The diameter of the first opening 43*b* is, for example, not less than 110 μm and not more than 130 μm. The diameter of the first opening 43*c* is, for example, not less than 90 μm and not more than 110 μm. The diameter of the first opening 43*d* is, for example, not less than 70 μm and not more than 90 μm. The diameter of the first opening 43*e* is, for example, not less than 50 μm and not more than 70 μm.

In a plan view, two or more second axes a2 are parallel to the first axis a1; on each second axis a2, a plurality of first openings 43 having mutually-different areas are arranged. The areas of the plurality of first openings 43 arranged on each second axis a2 increase as the shortest distance between the first p-side electrode 21 and the first opening 43 decreases.

Evaluation results of the light-emitting element reliability will now be described for a light-emitting element of a reference example and light-emitting elements of examples 1 to 6 made to have the configurations of the embodiments described above. The evaluation of the light-emitting element reliability was performed by making two light-emitting elements for each of the light-emitting element of the reference example and the light-emitting elements of the examples 1 to 6, by driving for 300 hours at a current value of 3000 mA, and then by evaluating based on the test results of measuring a Vf value when each light-emitting element was driven at a current value of 5 mA. There was a tendency for the Vf value to have a small value when a short occurred due to heat generation, etc., in the light-emitting element. In the test, the light-emitting element was determined to have malfunctioned when the Vf value was not more than 3 V.

The example 1 had the configuration of the light-emitting element 3 of the third embodiment shown in FIG. 4.

The example 2 had the configuration of the light-emitting element 4 of the fourth embodiment shown in FIG. 5.

The example 3 had the configuration of the light-emitting element 5 of the fifth embodiment shown in FIG. 6.

The example 4 had the configuration of the light-emitting element 6 of the sixth embodiment shown in FIG. 7.

The example 5 had the configuration of the light-emitting element 7 of the seventh embodiment shown in FIG. 8.

The example 6 had the configuration of the light-emitting element 8 of the eighth embodiment shown in FIG. 9.

Figure 10:
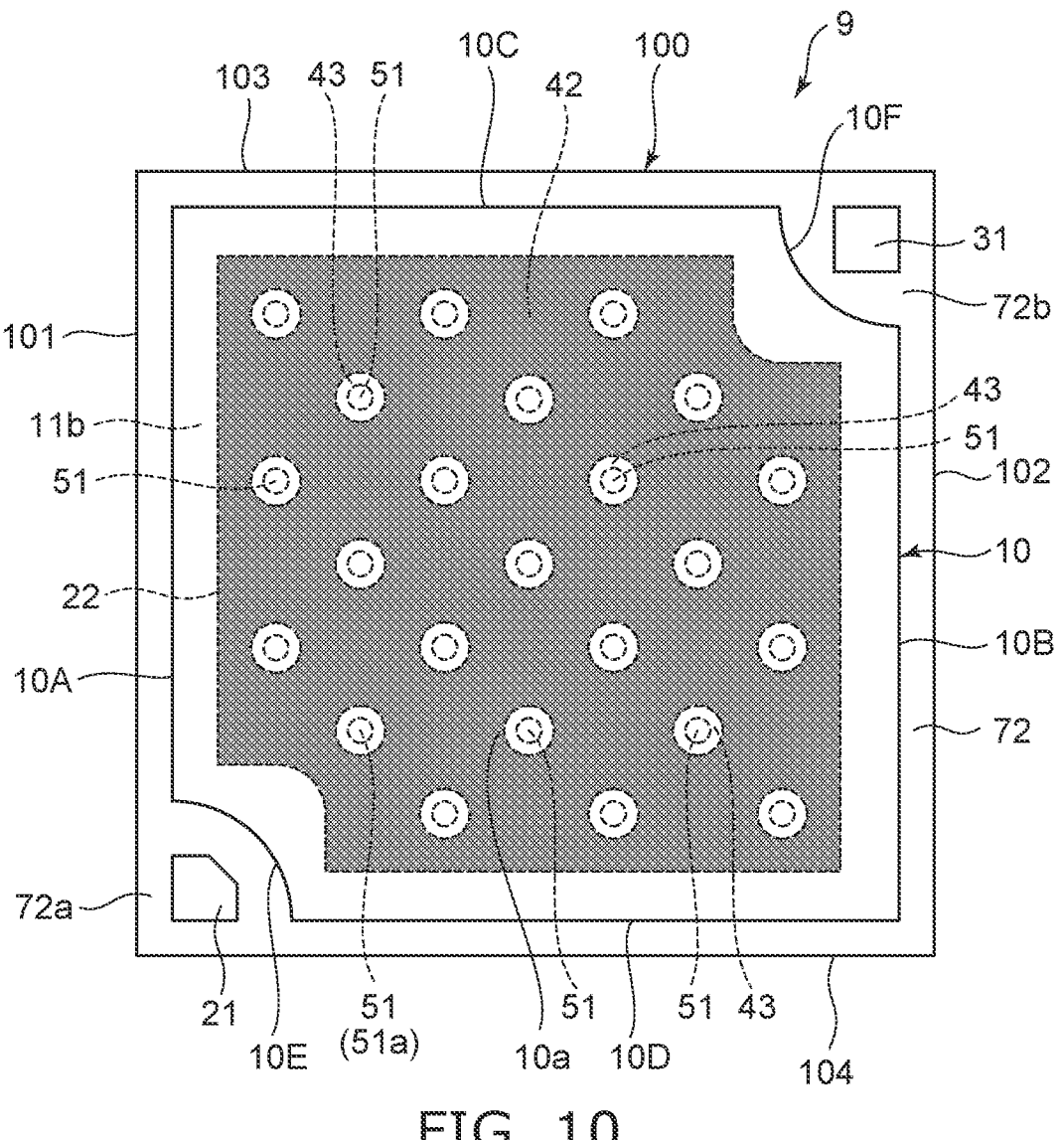
FIG. 10 is a schematic plan view of a light-emitting element of a reference example.

The reference example had the configuration of a light-emitting element 9 shown in FIG. 10. In the reference example, the p-side wiring layer 40 was electrically connected with the second p-side electrode 22 over substantially the entire surface of the second p-side electrode 22. In FIG. 10 as well, similarly to the other drawings, the second p-side connection portion 42 of the p-side wiring layer 40 connected with the second p-side electrode 22 is illustrated by cross-hatching regions. In the reference example, the shortest distance between the first p-side electrode 21 and the second p-side connection portion 42 was less than the shortest distance between the first p-side electrode 21 and the first n-side connection portion 51*a* among the plurality of first n-side connection portions 51 most proximate to the first p-side electrode 21 in a plan view.

Only the position and area of the second p-side connection portion 42 in a plan view were respectively different between the examples 1 to 6 and the reference example; otherwise, the configurations were the same. The common configuration of the light-emitting elements of the examples 1 to 6 and the light-emitting element of the reference example will now be described. Metal layers including Ti, Pt, and Au were used as the first p-side electrode 21 and the first n-side electrode 31. The thicknesses of the first p-side electrode 21 and the first n-side electrode 31 were 0.7 μm. Metal layers including Ti and Rh were used as the p-side wiring layer 40 and the conductive layer 60. The thicknesses of the p-side wiring layer 40 and the conductive layer 60 were 0.3 μm. A metal layer including Ag, Ni, Ti, and Pt was used as the second p-side electrode 22. The thickness of the second p-side electrode 22 was 0.7 μm. A metal layer including Ti, Al, Si, and Cu was used as the n-side wiring layer 50. The thickness of the n-side wiring layer 50 was 0.4

µm. A plurality of semiconductor layers including Al$_a$Ga$_{1-a}$N (0<a≤0.5) were used as the semiconductor structure body 10. A silicon substrate was used as the substrate 100. The shape of the substrate 100 in a plan view was a square having one side of 1000 µm. A metal layer including Pt, Ti, Ni, Sn, and Au was used as the bonding layer 110. The maximum thickness of the bonding layer 110 was 10 µm. Silicon oxide films were used as the first insulating film 71, the second insulating film 72, the third insulating film 73, and the protective film 90. The thickness of the first insulating film 71 was 0.4 µm, the thickness of the second insulating film 72 was 0.8 µm, the thickness of the third insulating film 73 was 0.8 µm, and the thickness of the protective film 90 was 0.8 µm.

The results of the test described above are as follows.

Malfunctions were not confirmed for either of the two light-emitting elements for the light-emitting elements of the examples 1 to 4.

Malfunctions were confirmed for one light-emitting element among the two light-emitting elements for the light-emitting elements of the examples 5 and 6.

Malfunctions were confirmed for both of the two light-emitting elements for the light-emitting element of the reference example.

It was confirmed from these results that compared with the light-emitting element of the reference example, the light-emitting elements of the examples had high reliability.

Embodiments of the present invention have been described with reference to specific examples. However, the present invention is not limited to these specific examples. Based on the above-described embodiments of the present invention, all embodiments that can be implemented with appropriate design modification by one skilled in the art are also within the scope of the present invention as long as the gist of the present invention is included. Further, within the scope of the spirit of the present invention, one skilled in the art can conceive various modifications, and the modifications fall within the scope of the present invention.

What is claimed is:

1. A light-emitting element having a quadrilateral shape in a plan view, comprising:

a semiconductor structure body including
an n-side layer,
a p-side layer, and
an active layer positioned between the n-side layer and the p-side layer,
the n-side layer including a plurality of first regions exposed from the active layer and the p-side layer in the plan view;
a first p-side electrode located outside the semiconductor structure body in the plan view;
a second p-side electrode located on a side of a surface of the p-side layer opposite to a surface on which the active layer is located;
a p-side wiring layer including
a first p-side connection portion connected with the first p-side electrode, and
at least one second p-side connection portion connected with the second p-side electrode, the at least one second p-side connection portion overlapping an intersection point of diagonals of the quadrilateral shape of the light-emitting element in the plan view; and
an n-side wiring layer including a plurality of first n-side connection portions connected to the plurality of first regions of the n-side layer, wherein in the plan view, a shortest distance between the first p-side electrode and the at least one second p-side connection portion is greater than a shortest distance between the first p-side electrode and a closest one of the plurality of first n-side connection portions that is most proximate to the first p-side electrode among the plurality of first n-side connection portions, in the plan view, the second p-side electrode is located at least in a region between the first p-side electrode and the closest one of the plurality of first n-side connection portions.

2. The light-emitting element according to claim 1, wherein the at least one second p-side connection portion is one of a plurality of second p-side connection portions, and the plurality of second p-side connection portions are spaced apart from each other in the plan view.

3. The light-emitting element according to claim 2, wherein at least one of the plurality of second p-side connection portions is located between adjacent ones of the plurality of first n-side connection portions in the plan view.

4. The light-emitting element according to claim 2, wherein the plurality of second p-side connection portions include
at least one second p-side connection portion to which a shortest distance from the first p-side electrode is a third distance,
at least one second p-side connection portion to which a shortest distance from the first p-side electrode is a fourth distance greater than the third distance,
the third distance is the shortest among shortest distances between the first p-side electrode and respective ones of the second p-side connection portions, and
in the plan view, an area of the at least one second p-side connection portion to which the shortest distance from the first p-side electrode is the third distance is less than an area of the at least one second p-side connection portion to which the shortest distance from the first p-side electrode is the fourth distance.

5. The light-emitting element according to claim 1, wherein the shortest distance between the first p-side electrode and the at least one second p-side connection portion in the plan view is not less than 100 µm and not more than 500 µm.

6. The light-emitting element according to claim 1, wherein the semiconductor structure body has a generally quadrilateral shape in the plan view, and the at least one second p-side connection portion is positioned in at least a region including a center of the semiconductor structure body in the plan view, the center of the semiconductor structure body being an intersection point of diagonals of the generally quadrilateral shape of the semiconductor structure body in the plan view.

7. The light-emitting element according to claim 1, wherein an area of the at least one second p-side connection portion in the plan view is not less than 10% and not more than 90% of an area of the p-side layer in the plan view.

8. A light-emitting element comprising:

a semiconductor structure body including an n-side layer, a p-side layer, and an active layer positioned between the n-side layer and the p-side layer, the n-side layer including a plurality of first regions exposed from the active layer and the p-side layer in a plan view;

a first p-side electrode located outside the semiconductor structure body in the plan view;

a first n-side electrode located outside the semiconductor structure body in the plan view;

a second p-side electrode located on a side of a surface of the p-side layer opposite to a surface of the p-side layer on which the active layer is located;

a p-side wiring layer including a first p-side connection portion connected with the first p-side electrode, and at least one second p-side connection portion connected with the second p-side electrode; and an n-side wiring layer including a plurality of first n-side connection portions connected to the plurality of first regions of the n-side layer, wherein the p-side wiring layer includes a plurality of first openings that overlap the plurality of first regions in the plan view, the plurality of first openings having mutually-different areas are arranged on a first axis connecting the first p-side electrode and the first n-side electrode with a shortest distance in the plan view, an area of one of the plurality of first openings positioned at a first distance from the first p-side electrode is greater than an area of one of the plurality of first openings positioned at a second distance from the first p-side electrode in the plan view, the second distance is greater than the first distance, each of the first distance and the second distance is a shortest distance between the first p-side electrode and a respective one of the first openings, the first distance is the shortest among shortest distances between the first p-side electrode and the plurality of first openings, respectively.

9. The light-emitting element according to claim 8, wherein the at least one second p-side connection portion is positioned in at least a region including a center of the semiconductor structure body in the plan view.

10. The light-emitting element according to claim 8, wherein an area of the at least one second p-side connection portion in the plan view is not less than 10% and not more than 90% of an area of the p-side layer in the plan view.

11. The light-emitting element according to claim 8, wherein the first n-side electrode is connected with the n-side wiring layer, an area of one of the plurality of first openings that is more proximate to the first p-side electrode than to the first n-side electrode is greater than an area of one of the plurality of first openings that is more proximate to the first n-side electrode than to the first p-side electrode in the plan view.

12. A light-emitting element comprising:

a semiconductor structure body including an n-side layer, a p-side layer, and an active layer positioned between the n-side layer and the p-side layer, the n-side layer including a plurality of first regions exposed from the active layer and the p-side layer in a plan view;

a first p-side electrode located outside the semiconductor structure body in the plan view;

a second p-side electrode located on a side of a surface of the p-side layer opposite to a surface on which the active layer is located;

a p-side wiring layer including a first p-side connection portion connected with the first p-side electrode, and at least one second p-side connection portion connected with the second p-side electrode; and an n-side wiring layer including a plurality of first n-side connection portions connected to the plurality of first regions of the n-side layer, wherein in the plan view, a shortest distance between the first p-side electrode and the at least one second p-side connection portion is greater than a shortest distance between the first p-side electrode and a closest one of the plurality of first n-side connection portions that is most proximate to the first p-side electrode among the plurality of first n-side connection portions, in the plan view, the second p-side electrode is located at least in a region between the first p-side electrode and the closest one of the plurality of first n-side connection portions, the at least one second p-side connection portion is one of a plurality of second p-side connection portions, and the plurality of second p-side connection portions are spaced apart from each other in the plan view, the plurality of second p-side connection portions include at least one second p-side connection portion to which a shortest distance from the first p-side electrode is a third distance, and at least one second p-side connection portion to which a shortest distance from the first p-side electrode is a fourth distance greater than the third distance, the third distance is the shortest among shortest distances between the first p-side electrode and respective ones of the second p-side connection portions, and in the plan view, an area of the at least one second p-side connection portion to which the shortest distance from the first p-side electrode is the third distance is less than an area of the at least one second p-side connection portion to which the shortest distance from the first p-side electrode is the fourth distance.

* * * * *